United States Patent
Yang et al.

(10) Patent No.: US 6,361,928 B1
(45) Date of Patent: Mar. 26, 2002

(54) METHOD OF DEFINING A MASK PATTERN FOR A PHOTORESIST LAYER IN SEMICONDUCTOR FABRICATION

(75) Inventors: Jin-Sheng Yang, Hsinchu; Tzung-Han Lee, Taipei, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/578,358

(22) Filed: May 24, 2000

(30) Foreign Application Priority Data

Mar. 4, 2000 (TW) .......................... 089103867

(51) Int. Cl.[7] ................................ G03F 7/40
(52) U.S. Cl. ................ 430/328; 430/322; 430/330; 430/350; 430/313; 430/317; 438/632
(58) Field of Search .................. 430/313, 317, 430/322, 328, 330, 331, 336, 350; 438/632

(56) References Cited

U.S. PATENT DOCUMENTS 5,096,802 A * 3/1992 Hu .............................. 430/328
5,250,375 A * 10/1993 Sebald et al. ................... 430/8
6,127,098 A * 10/2000 Nakagawa et al. ......... 430/315
6,265,306 B1 * 7/2001 Starnes et al. .............. 438/632

* cited by examiner

*Primary Examiner*—Janet Baxter
*Assistant Examiner*—Yvette M. Clarke
(74) *Attorney, Agent, or Firm*—J.C. Patents

(57) ABSTRACT

A method of defining a mask pattern for a photoresist layer in semiconductor fabrication. The method coats a photoresist layer containing an additive on a dielectric layer. The photoresist layer has an opening formed therein. The additive is 2,2'-azo-bis-isobutyronitride (AIBN) or phenyl-azo-triphenylmethane. The photoresist layer is exposed and developed. Then, a hard baking step is performed. A UV curing or a hot curing step is performed on the photoresist layer. As a result, the additive in the photoresist layer reacts to form nitrogen ($N_2$) gas. Nitrogen gas makes the photoresist layer expand. The opening is decreased by the expansion of the photoresist layer. The dielectric layer is etched according to the expanded photoresist layer so that a via or a trench, which is smaller than a conventional one, is formed.

10 Claims, 3 Drawing Sheets

METHOD OF DEFINING A MASK PATTERN FOR A PHOTORESIST LAYER IN SEMICONDUCTOR FABRICATION

CROSS-REFERENCE TO RELATED APPLICATION

This application claims the priority benefit of Taiwan application Ser. No. 89103867, filed Mar. 4, 2000.

BACKGROUND OF THE INVENTION

1. Field of the Invention

This invention relates to semiconductor fabrication technology, and more particularly, to a method of defining a mask pattern for a photoresist layer, which can help reduce the critical dimension of the pattern transferred from the mask.

2. Description of the Related Art

High integration is the primary goal in the fabrication of integrated circuit (IC) devices. To achieve this goal, the various components in the integrated circuit have the smallest dimensions possible. Current semiconductor fabrication technology is able to fabricate integrated circuits down to the 0.25 μm (micrometer) submicron level of integration. Photolithography is the key technology in the fabrication of MOS (metal-oxide semiconductor) related semiconductor structures, such as doped areas and contact openings. In submicron integration, the pattern transfer from a mask through photolithography is highly critical. Various methods, such as Optical Proximity Correction (OPC) and Phase Shift Mask (PSM), have been proposed to achieve high definition for the photolithographic transfer of a pattern from a mask onto a photoresist layer.

The OPC method is designed for the purpose of minimizing the deviation in the critical dimension of the transferred pattern due to a proximity effect. During the photolithographic process, the exposure light passing through the mask and striking the photoresist layer is widely scattered due to dispersion. Moreover, the exposure light transmitting through the photoresist layer reflects back from the substrate, causing interference that then causes double-exposure on the photoresist layer. As a result, the critical dimension of the transferred pattern from the mask is degraded. This undesired proximity effect is illustratively depicted in FIGS. 1 and 2.

In FIG. 1, the dashed rectangular area indicated by the reference numeral 10 is the intended pattern that is to be transferred from the mask onto the photoresist layer. Due to the proximity effect, however, the actually resulting pattern is shrunk in size to the shaded area indicated by the reference numeral 11. In FIG. 2, the dashed areas indicated by the reference numeral 20 are the intended patterns that are to be transferred from the mask onto the photoresist layer. Due to the proximity effect, however, the actually resulting pattern deviates from the intended positions and is inaccurately dimensioned, as seen in the shaded areas indicated by the reference numeral 21. The OPC method solves the foregoing problem by first using computer software to compute the dimensional and positional deviations between the resulting patterns on the photoresist layer and the predefined patterns on the mask, and then using the data to correct the size and position of the patterns on the mask. This can improve accurate definition of the transferred patterns. One drawback to the OPC method, however, is that it requires complex computation to obtain the necessary corrections to the mask patterns and is therefore very difficult to implement.

FIG. 3A is a schematic diagram used to explain the principle of photolithography, whereas FIG. 3B is a schematic diagram used to explain the principle of the PSM method. These two diagrams are juxtaposed for the purpose of comparison. As shown in FIG. 3A, conventional photolithography utilizes a mask including a predefined pattern of chromium layers 100 coated on a crystal sheet 150. The chromium layers 100 represent the pattern that is to be transferred onto the photoresist layer (not shown). The chromium layers 100 are opaque to light. During the exposure process, exposure light 170 passes through the mask to illuminate the unmasked portions of the photoresist layer (not shown). The amplitude distribution of the exposure light 170 over the mask, the amplitude distribution of the exposure light 170 over the photoresist layer, and the intensity distribution of the exposure light 170 over the photoresist layer are respectively illustrated in the three graphs beneath.

As shown in FIG. 3B, by the PSM method, the mask is additionally provided with a phase-shifter layer 120 which can invert the phase of the light passing therethrough. The light passing through the phase-shifter layer 120 thus interferes in a destructive manner with the neighboring light that does not pass through the phase-shifter layer 120, thus creating sharp definition in the transferred pattern. The PSM method has the benefit of enhancing the definition of the transferred pattern without having to use short-wavelength exposure light. One drawback to the PSM method, however, is that the mask is quite difficult to manufacture and modify.

Although the foregoing OPC and PSM methods can help enhance the pattern definition in downsized fabrication of integrated circuits, use of them is still suboptimal due to complex and costly implementation.

SUMMARY OF THE INVENTION

The invention provides a method of defining a mask pattern for a photoresist layer in semiconductor fabrication. A pattern having smaller opening is formed, even when using a conventional photomask.

The method of the invention comprises coating a photoresist layer containing an additive on a dielectric layer. The photoresist layer has an opening formed therein. The additive comprises 2,2'-azo-bis-isobutyronitride (AIBN) or phenyl-azo-triphenylmethane. The photoresist layer is exposed and developed. Then, a hard baking step is performed. A UV curing or a hot curing step is performed at the photoresist layer. As a result, the additive in the photoresist layer reacts to form nitrogen ($N_2$) gas. Nitrogen gas makes the photoresist layer expand. The opening is decreased by the expansion of the photoresist layer. The dielectric layer is etched according to the expanded photoresist layer so that a via or a trench, smaller than a conventional one, is formed.

The invention provides a method comprising adding a compound into a photoresist material. When the additive is heated or exposed to UV light, the photoresist material increases. Thus, critical dimension size can be improved.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
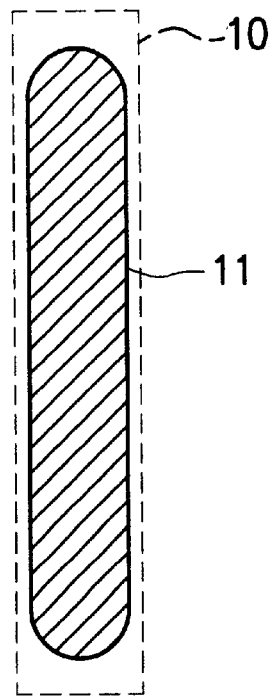
FIG. 1 is a schematic diagram used to depict the deviation between an actually transferred pattern and the intended one due to proximity effect.
Figure 2:
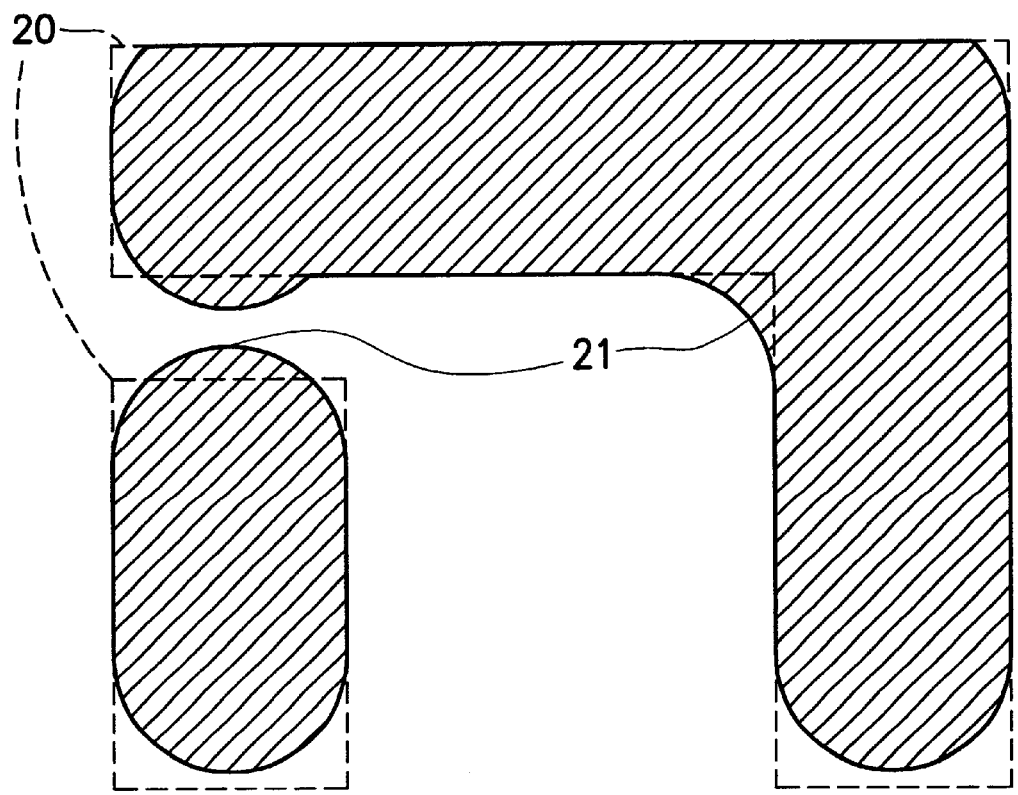
FIG. 2 is a schematic diagram used to depict the deviation between two actually transferred patterns and the intended ones due to proximity effect.
Figures 3A, 3B:
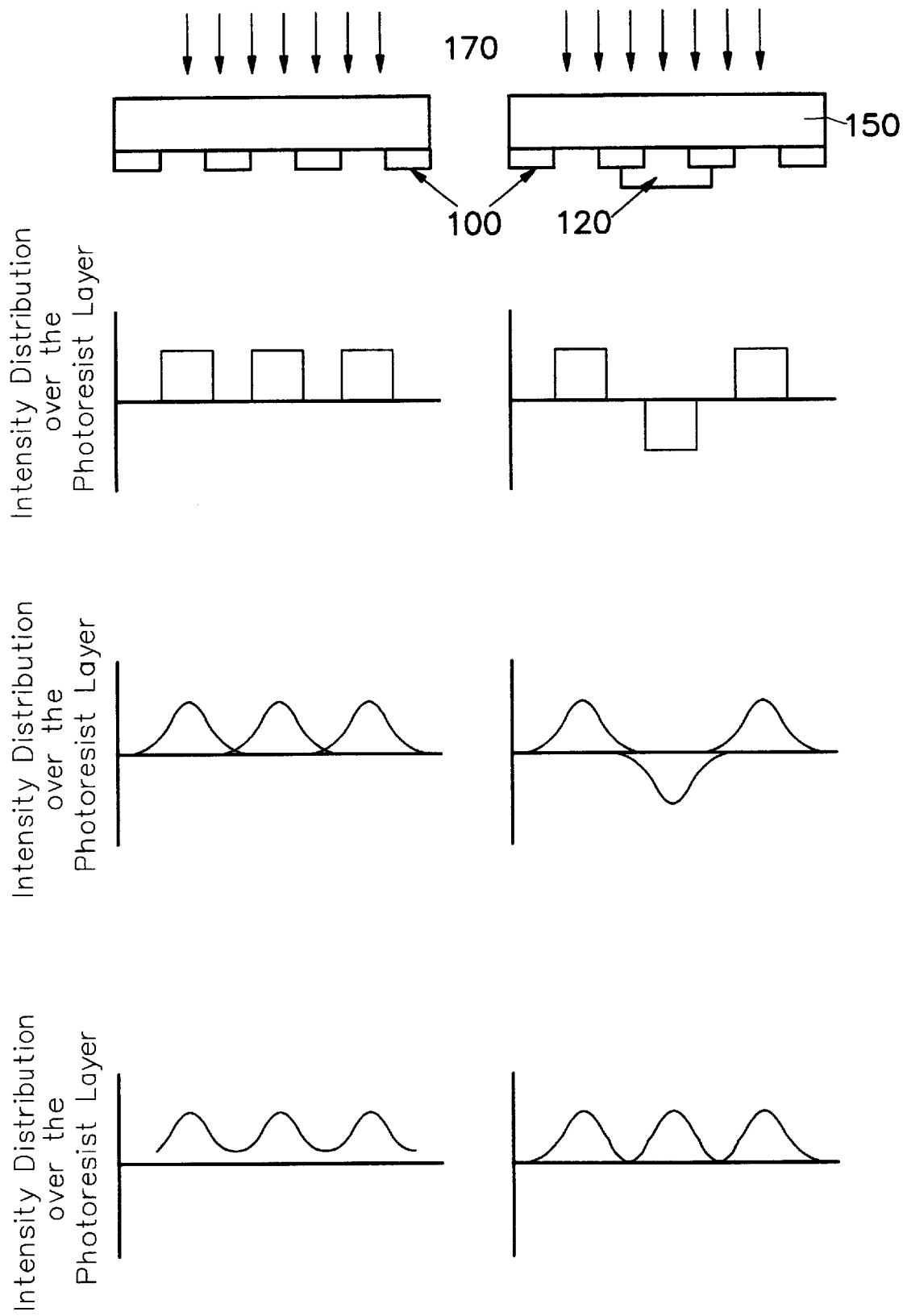
FIG. 3A is a schematic diagram used to explain the principle of photolithography.
FIG. 3B is a schematic diagram used to explain the principle of the PSM method.
Figure 4A:
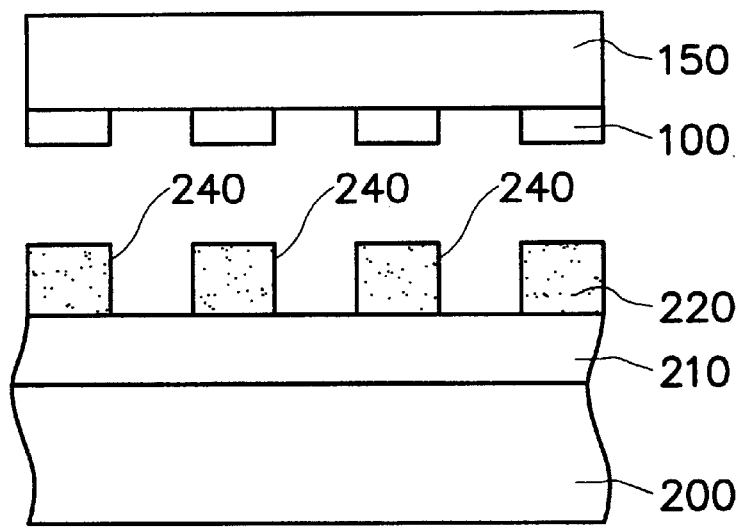
FIGS. 4A–4C are schematic sectional diagrams used to depict the steps involved in the method of the invention for defining a mask pattern for a photoresist layer in semiconductor fabrication.
Figure 4B:
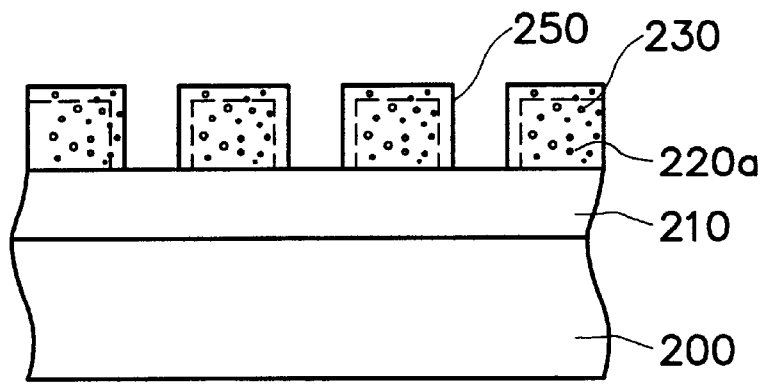
Figure 4C:
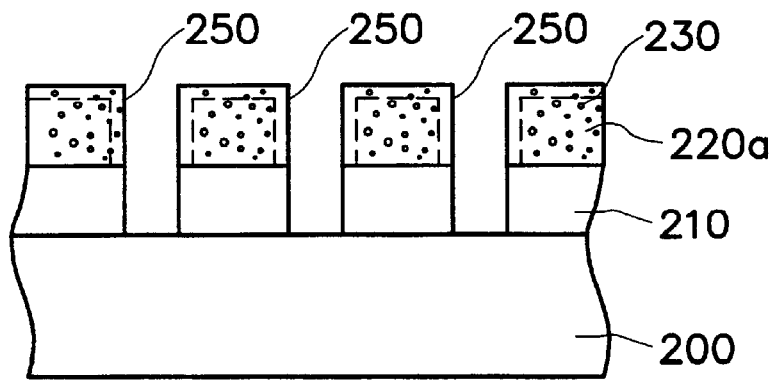

FIGS. 4A–4C are schematic sectional diagrams used to depict the steps involved in the method of the invention for defining a mask pattern for a photoresist layer in semiconductor fabrication.

Broadly speaking, the method of the invention is used to form a mask pattern for a photoresist layer in semiconductor fabrication, with the photoresist mask being used to define and form openings, such as contact openings or via openings, in a dielectric layer or in a damascene structure. In the following preferred embodiment, the method of the invention is used to form contact openings in a dielectric layer.

Referring to FIG. 4A, the method of the invention is applied to a semiconductor substrate 200 on which a dielectric layer 210, such as a layer of silicon dioxide, is already formed. A photoresist layer 220 is coated over the dielectric layer 210. A photolithographic process is performed on the photoresist layer 220 with a binary mask (BIM) that includes a predefined mask pattern of chromium layers 100 on a crystal sheet 150. The chromium layers 100 are opaque to an exposure light. The photoresist layer 220 contains an additive. The additive comprises a compound, such as 2,2'-azo-bis-isobutyronitride (AIBN) or phenyl-azo-triphenylmethane. The photoresist layer 220 is exposed and developed to form a mask pattern 240 within the photoresist layer 220 as shown in FIG. 4A.

Referring to FIG. 4B, after developing the photoresist layer 220, the photoresist layer 220 is exposed to a UV light to cure the photoresist material. A wavelength of the UV light is not larger than 3600 Å. The compound added into the photoresist layer reacts and releases a gas, such as nitrogen, when exposed to the UV light. The gas fills the photoresist layer 220a and makes the photoresist layer 220a expand. Thus, the size of the mask pattern 240 decreases. An expansion ratio of the photoresist layer 220a depends on how much compound is added. When the photoresist layer 220a is exposed to the UV light, the compound, such as AIBN, reacts to form nitrogen and isobutyronitride radicals. The radicals can form cross-linking bonds with the photoresist material to improve the quality of the photoresist layer 220a.

Referring to FIG. 4C, an anisotropic etching, such as dry etching, is performed using the expanded photoresist layer 220a as a mask. A part of the dielectric layer 210 is thus removed to form a contact opening 250.

In the case of via openings, the exposed portions of the substrate 200 are metallization layers, and in the case of openings in damascene structures, the exposed portions of the substrate 200 are either metallization layers or insulating layers.

In conclusion, the method of the invention can help downsize the openings in the dielectric layer simply by expanding the photoresist layer and without having to make any modifications to the existing mask. Compared to the prior art, the method of the invention is easier and more cost-effective to implement.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of defining a mask pattern for a photoresist layer in semiconductor fabrication, wherein a substrate comprises a dielectric layer formed thereon is provided, comprising the steps of:

forming a photoresist layer on the dielectric layer, wherein a compound is added to the photoresist layer;

exposing and developing the photoresist layer to form at least one opening within the photoresist layer; and providing a UV light to irradiate the photoresist layer, wherein the UV light causes the compound to react and thereby form gas which expands the photoresist layer.

2. The method according to claim 1, wherein the compound comprises 2,2'-azo-bis-isobutyronitride (AIBN).

3. The method according to claim 1, wherein the compound comprises phenyl-azo-triphenylmethane.

4. The method according to claim 1, wherein the gas comprises nitrogen.

5. The method according to claim 1, wherein a wavelength of the UV light is not larger than 3600 Å.

6. A method of forming a opening within a provided dielectric layer, comprising the steps of:

forming a photoresist layer with an additive on the provided dielectric layer, wherein the additive reacts to release a gas while a UV light is incident thereon;

exposing and developing the photoresist layer to form an opening pattern within the photoresist layer;

exposing the photoresist layer to the UV light to release the gas and further to expand the photoresist layer;

etching the dielectric layer while using the expanded photoresist layer as a mask to form the opening in the dielectric layer; and removing the photoresist layer.

7. The method according to claim 6, wherein the compound comprises 2,2'-azo-bis-isobutyronitride (AIBN).

8. The method according to claim 6, wherein the compound comprises phenyl-azo-triphenylmethane.

9. The method according to claim 6, wherein the gas comprises nitrogen.

10. The method according to claim 6, wherein a wavelength of the UV light is not larger than 3600 Å.

* * * * *